US012347682B2

(12) United States Patent
Chao et al.

(10) Patent No.: US 12,347,682 B2
(45) Date of Patent: Jul. 1, 2025

(54) USING CUMULATIVE HEAT AMOUNT DATA TO QUALIFY HOT PLATE USED FOR POST-EXPOSURE BAKING

(71) Applicant: Taiwan Semiconductor Manufacturing Co., Ltd., Hsinchu (TW)

(72) Inventors: Chia-Cheng Chao, Hsinchu (TW); Chung-Cheng Wang, Hsinchu (TW); Chun-Kuang Chen, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/771,784

(22) Filed: Jul. 12, 2024

(65) Prior Publication Data

US 2024/0371639 A1 Nov. 7, 2024

Related U.S. Application Data

(60) Continuation of application No. 17/572,432, filed on Jan. 10, 2022, now Pat. No. 12,062,542, which is a (Continued)

(51) Int. Cl.
*H01L 21/027* (2006.01)
*H01L 21/66* (2006.01)

(Continued)

(52) U.S. Cl.
CPC .... *H01L 21/0274* (2013.01); *H01L 21/67109* (2013.01); *H01L 21/67248* (2013.01);

(Continued)

(58) Field of Classification Search
CPC ........ H05B 3/686; H05B 1/0233; H05B 3/24; H01L 21/67248; H01L 21/0274; H01L 21/67109; H01L 22/20
See application file for complete search history.

(56) References Cited

U.S. PATENT DOCUMENTS 4,719,586 A 1/1988 Moyer
6,605,814 B1 * 8/2003 Tadika ................ H01L 21/6838 250/443.1

(Continued)

FOREIGN PATENT DOCUMENTS

JP 2008034685 A 2/2008
JP 2017146161 A 8/2017

(Continued)

*Primary Examiner* — Dana Ross
*Assistant Examiner* — Kuangyue Chen
(74) *Attorney, Agent, or Firm* — HAYNES AND BOONE, LLP

(57) ABSTRACT

A test wafer is placed inside a baking module and is baked. Via one or more temperature sensors, a cumulative heat amount delivered to the test wafer during the baking is measured. The measured cumulative heat amount is compared with a predefined cumulative heat amount threshold. In response to the comparing indicating that the measured cumulative heat amount is within the predefined cumulative heat amount threshold, it is determined that the baking module is qualified for actual semiconductor fabrication. In response to the comparing indicating that the measured cumulative heat amount is outside of the predefined cumulative heat amount threshold, it is determined that the baking module is not qualified for actual semiconductor fabrication.

20 Claims, 15 Drawing Sheets

500
510
520
560
540
550
530
550
VAC
VAC

Related U.S. Application Data division of application No. 15/708,791, filed on Sep. 19, 2017, now Pat. No. 11,222,783.

(51) Int. Cl.

| | |
|---|---|
| ***H01L 21/67*** | (2006.01) |
| ***H05B 1/02*** | (2006.01) |
| ***H05B 3/24*** | (2006.01) |
| ***H05B 3/68*** | (2006.01) |

(52) U.S. Cl.

CPC .......... *H01L 22/20* (2013.01); *H05B 1/0233* (2013.01); *H05B 3/24* (2013.01); *H05B 3/686* (2013.01)

(56) References Cited

U.S. PATENT DOCUMENTS

| | | | |
|---|---|---|---|
| 8,716,841 | B1 | 5/2014 | Chang et al. |
| 8,736,084 | B2 | 5/2014 | Cheng et al. |
| 8,796,666 | B1 | 8/2014 | Huang et al. |
| 8,837,810 | B2 | 9/2014 | Chen et al. |
| 9,012,132 | B2 | 4/2015 | Chang |
| 9,028,915 | B2 | 5/2015 | Chang et al. |
| 9,093,530 | B2 | 7/2015 | Huang et al. |
| 9,146,469 | B2 | 9/2015 | Liu et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 2003/0132218 | A1* | 7/2003 | Hiramatsu .......... H01L 21/6875 219/466.1 |
| 2005/0057733 | A1 | 3/2005 | Owen et al. |
| 2008/0076077 | A1 | 3/2008 | Nakagawa |
| 2008/0087359 | A1 | 4/2008 | Zurecki et al. |
| 2008/0135207 | A1* | 6/2008 | Fukuoka ........... H01L 21/67109 165/65 |
| 2008/0142500 | A1* | 6/2008 | Tomita .............. H01L 21/67184 219/444.1 |
| 2009/0121607 | A1 | 5/2009 | Tanino et al. |
| 2009/0160472 | A1 | 6/2009 | Segawa et al. |
| 2012/0308112 | A1 | 12/2012 | Hu et al. |
| 2013/0201461 | A1 | 8/2013 | Huang et al. |
| 2013/0258304 | A1 | 10/2013 | Chang et al. |
| 2014/0101624 | A1 | 4/2014 | Wu et al. |
| 2014/0111779 | A1 | 4/2014 | Chen et al. |
| 2014/0119638 | A1 | 5/2014 | Chang et al. |
| 2014/0123084 | A1 | 5/2014 | Tang et al. |
| 2014/0226893 | A1 | 8/2014 | Lo et al. |
| 2014/0253901 | A1 | 9/2014 | Zhou et al. |
| 2014/0256067 | A1 | 9/2014 | Cheng et al. |
| 2014/0257761 | A1 | 9/2014 | Zhou et al. |
| 2015/0378416 | A1 | 12/2015 | Wang |
| 2016/0302258 | A1 | 10/2016 | Hayashi et al. |
| 2017/0221783 | A1 | 8/2017 | Tedeschi et al. |
| 2017/0234737 | A1 | 8/2017 | Nogami et al. |

FOREIGN PATENT DOCUMENTS

| | | | |
|---|---|---|---|
| KR | 20070019945 | A | 2/2007 |
| TW | 200425372 | A | 11/2004 |
| TW | 201316414 | A | 4/2013 |
| TW | 201428247 | A | 7/2014 |
| TW | 201506437 | A | 2/2015 |
| TW | 201614760 | A | 4/2016 |
| TW | 201724336 | A | 7/2017 |

* cited by examiner

810

For hot plate 1

| RTD wafer | Accumulated temp. | | RTD wafer | Accumulated temp. | |
|---|---|---|---|---|---|
| | Ramp | Static | | Ramp | Static |
| RTD1 | 5030.921 | 4224.444 | RTD16 | 5031.554 | 4224.354 |
| RTD2 | 5030.565 | 4224.828 | RTD17 | 5034.491 | 4224.748 |
| RTD3 | 5031.359 | 4224.416 | RTD18 | 5032.999 | 4225.205 |
| RTD4 | 5034.333 | 4224.476 | RTD19 | 5032.028 | 4224.389 |
| RTD5 | 5032.410 | 4225.284 | RTD20 | 5033.640 | 4224.790 |
| RTD6 | 5031.986 | 4225.047 | RTD21 | 5029.909 | 4223.929 |
| RTD7 | 5033.130 | 4224.456 | RTD22 | 5032.418 | 4224.526 |
| RTD8 | 5032.138 | 4224.078 | RTD23 | 5034.752 | 4224.440 |
| RTD9 | 5031.782 | 4223.684 | RTD24 | 5029.092 | 4224.865 |
| RTD10 | 5034.437 | 4224.363 | RTD25 | 5032.125 | 4224.896 |
| RTD11 | 5033.795 | 4224.517 | RTD26 | 5032.790 | 4224.422 |
| RTD12 | 5030.455 | 4224.609 | RTD27 | 5032.085 | 4224.545 |
| RTD13 | 5031.327 | 4224.157 | RTD28 | 5032.077 | 5224.722 |
| RTD14 | 5035.672 | 4225.554 | RTD29 | 5032.604 | 4224.380 |
| RTD15 | 5033.150 | 4224.455 | 3-sigma | 4.539033666 | |
| | | | Average | | 4224.57169 |

For hot plate 1

| RTD wafer | Accumulated temp. | |
|---|---|---|
| | Ramp | Static |
| CH1 | 5033.69060 | 4224.70320 |
| CH2 | 5032.63350 | 4224.68433 |
| CH3 | 5032.00183 | 4224.56283 |
| CH4 | 5030.88850 | 4224.48700 |
| CH5 | 5031.72883 | 4391.22967 |
| CH6 | 5032.02800 | 4224.38900 |
| CH7 | 5033.13000 | 4224.45600 |
| CH8 | 5030.92100 | 4224.44400 |
| CH9 | 5031.35900 | 4224.41600 |
| CH10 | 5033.79500 | 4224.51700 |
| CH11 | 5032.79000 | 4224.42200 |
| CH12 | 5032.60400 | 4224.38000 |
| CH13 | 5032.08500 | 4224.54500 |
| Range | 2.90650 | |

For hot plate 2

| RTD wafer | Accumulated temp. | | RTD wafer | Accumulated temp. | |
|---|---|---|---|---|---|
| | Ramp | Static | | Ramp | Static |
| RTD1 | 5029.228 | 4224.757 | RTD16 | 5030.517 | 4224.747 |
| RTD2 | 5030.427 | 4225.315 | RTD17 | 5033.485 | 4225.142 |
| RTD3 | 5031.460 | 4224.782 | RTD18 | 5032.715 | 4225.742 |
| RTD4 | 5031.065 | 4224.697 | RTD19 | 5031.768 | 4224.885 |
| RTD5 | 5030.143 | 4225.458 | RTD20 | 5032.372 | 4225.223 |
| RTD6 | 5030.684 | 4225.518 | RTD21 | 5030.235 | 4224.444 |
| RTD7 | 5032.072 | 4225.037 | RTD22 | 5029.293 | 4224.910 |
| RTD8 | 5038.636 | 4224.356 | RTD23 | 5032.971 | 4224.711 |
| RTD9 | 5030.685 | 4224.120 | RTD24 | 5029.410 | 4225.385 |
| RTD10 | 5031.874 | 4224.693 | RTD25 | 5029.142 | 4225.157 |
| RTD11 | 5031.175 | 4224.909 | RTD26 | 5031.094 | 4225.749 |
| RTD12 | 5029.386 | 4225.009 | RTD27 | 5031.581 | 4224.986 |
| RTD13 | 5031.101 | 4224.719 | RTD28 | 5031.027 | 5225.167 |
| RTD14 | 5034.872 | 4226.159 | RTD29 | 5030.933 | 4224.856 |
| RTD15 | 5031.969 | 4224.947 | 3-sigma | 4.244478716 | |
| | | | Average | | 4225.02 |

For hot plate 2

| RTD wafer | Accumulated temp. | |
|---|---|---|
| | Ramp | Static |
| CH1 | 5032.32080 | 4225.15380 |
| CH2 | 5031.00067 | 4225.09817 |
| CH3 | 5030.44117 | 4224.96733 |
| CH4 | 5029.81850 | 4224.89517 |
| CH5 | 5030.34633 | 4224.96233 |
| CH6 | 5031.76800 | 4224.88500 |
| CH7 | 5032.07200 | 4225.03700 |
| CH8 | 5029.22800 | 4224.75700 |
| CH9 | 5031.46000 | 4224.78200 |
| CH10 | 5031.17500 | 4224.90900 |
| CH11 | 5031.09400 | 4225.74900 |
| CH12 | 5030.93300 | 4224.85600 |
| CH13 | 5031.58100 | 4224.98600 |
| Range | 3.09280 | |

FIG. 11B

USING CUMULATIVE HEAT AMOUNT DATA TO QUALIFY HOT PLATE USED FOR POST-EXPOSURE BAKING

PRIORITY DATA

The present application is a continuation of U.S. patent application Ser. No. 17/572,432, filed Jan. 10, 2022, which is a divisional of U.S. patent application Ser. No. 15/708,791, filed Sep. 19, 2017, now U.S. Pat. No. 11,222,783B2, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

As the scaling down process continues, heat uniformity control becomes more important in semiconductor fabrication. To ensure tools such as hot plates can produce satisfactory heat uniformity performance, qualification testing may be done to the hot plates. Unfortunately, existing methods of qualification testing have not been able to predict the heat uniformity performance of the hot plates with optimal accuracy.

Therefore, while conventional qualification testing for hot plates has been generally adequate for its intended purposes, it has not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A-10B show tables of accumulated heat amount data in accordance with some embodiments of the present disclosure.

FIGS. 11A-11B shows tables of accumulated heat amount data in accordance with some embodiments of the present disclosure.

DETAILED DESCRIPTION

Figure 1:
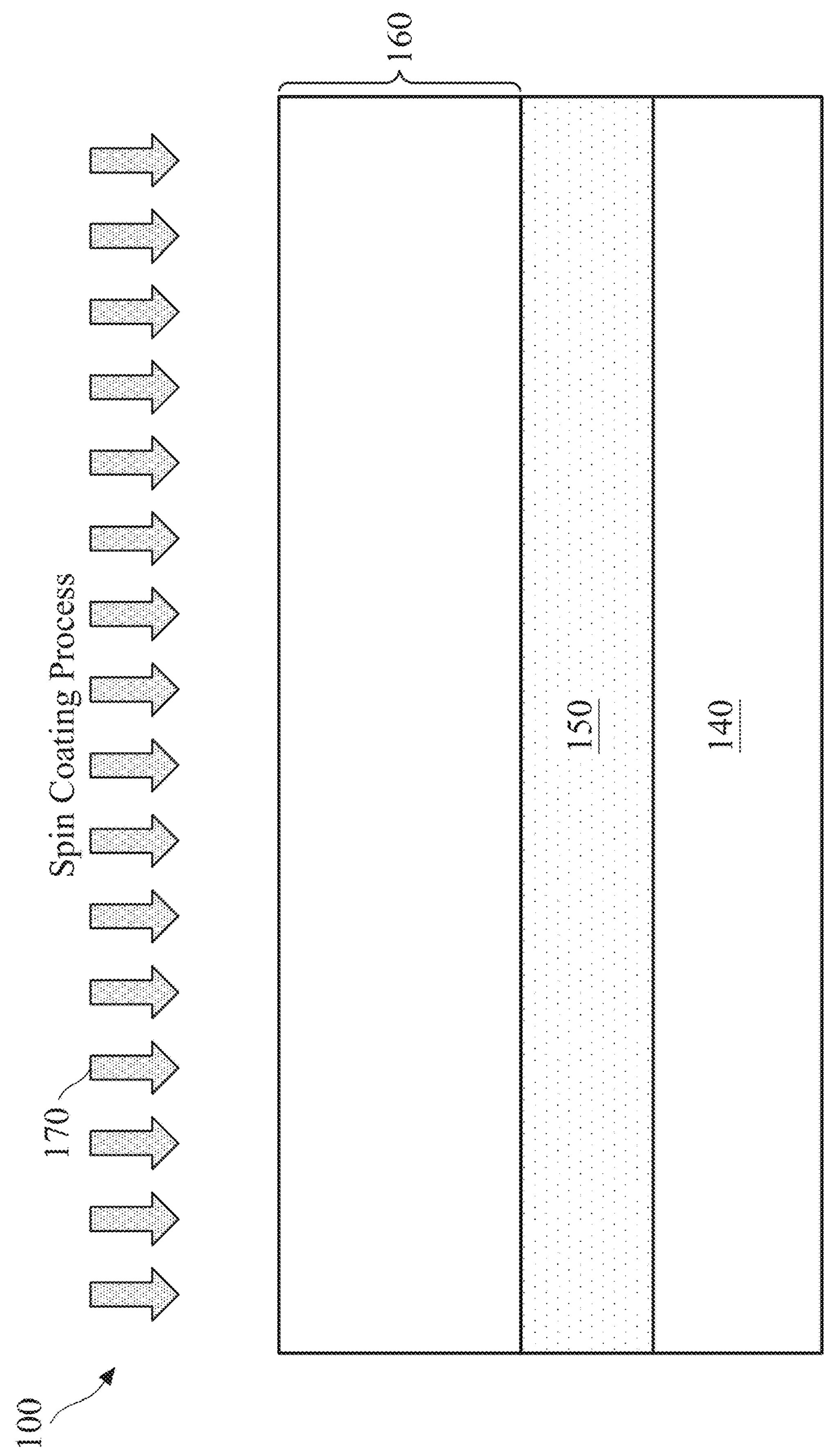
FIGS. 1-4 are diagrammatic fragmentary cross-sectional side views of a semiconductor device at various stages of fabrication in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the semiconductor scaling down process continues, the smaller feature sizes means that uniformity control becomes more important in semiconductor fabrication. For example, a semiconductor lithography process typically includes a post-exposure baking (PEB) step, where the exposed photoresist patterns are baked. The baking may be done by a baking module that includes a hot plate, where the hot plate heats up the wafer through heat radiation. However, if the heat distribution is not uniform throughout the hot plate, then different regions of the wafer may be heated differently. The lack of uniformity in the PEB process may lead to undesirable variations in pattern sizes, which could degrade semiconductor device performance. As such, the hot plate may need to be calibrated and qualified before being used for semiconductor fabrication.

Unfortunately, existing methods of qualifying these hot plates have not been able to accurately predict the performance of the hot plate. For example, existing methods of qualification testing for hot plates often rely on taking a single temperature measurement at a predefined point in time to evaluate the heat uniformity performance of the hot plate. This is not an optimal way to determine heat uniformity, however. Hence, semiconductor fabrication performed using these hot plates may result in device sizes having excessive fluctuations in critical dimension (CD), which degrades the IC device performance and may even lead to device failures.

According to the various aspects of the present disclosure, the heat uniformity performance is evaluated by determining a cumulative amount of heat over a period of time, rather than a single measurement. The cumulative amount of heat is then compared against various predefined thresholds in order to decide whether the hot plate should be qualified as being ready for actual semiconductor fabrication, as discussed in more detail below.

FIGS. 1-4 illustrate simplified diagrammatic fragmentary cross-sectional side views of a semiconductor device 100 at various stages of fabrication according to embodiments of the present disclosure. Referring to FIG. 1, a semiconductor device 100 includes a substrate 140. In some embodiments, the substrate 140 is a silicon substrate doped with a p-type dopant such as boron (for example a p-type substrate). Alternatively, the substrate 140 could be another suitable semiconductor material. For example, the substrate 140 may be a silicon substrate that is doped with an n-type dopant such as phosphorous or arsenic (an n-type substrate). The substrate 140 could include other elementary semiconductors such as germanium and diamond. The substrate 140 could optionally include a compound semiconductor and/or an alloy semiconductor. Further, the substrate 140 could include an epitaxial layer (epi layer), may be strained for performance enhancement, and may include a silicon-on-insulator (SOI) structure.

In some embodiments, the substrate 140 is substantially conductive or semi-conductive. The electrical resistance may be less than about 103 ohm-meter. In some embodiments, the substrate 140 contains metal, metal alloy, or metal nitride/sulfide/selenide/oxide/silicide with the formula $MX_a$, where M is a metal, and X is N, S, Se, O, Si, and where "a" is in a range from about 0.4 to 2.5. For example, the substrate 140 may contain Ti, Al, Co, Ru, TiN, $WN_2$, or TaN.

In some other embodiments, the substrate 140 contains a dielectric material with a dielectric constant in a range from about 1 to about 140. In some other embodiments, the substrate 140 contains Si, metal oxide, or metal nitride, where the formula is $MX_b$, wherein M is a metal or Si, and X is N or O, and wherein "b" is in a range from about 0.4 to 2.5. For example, the substrate 140 may contain $SiO_2$, silicon nitride, aluminum oxide, hafnium oxide, or lanthanum oxide.

A material layer 150 is formed over the substrate 140. The material layer 150 can be patterned via a lithography process and as such may also be referred to as a patternable layer. In an embodiment, the material layer 150 includes a dielectric material, such as silicon oxide or silicon nitride. In another embodiment, the material layer 150 includes metal. In yet another embodiment, the material layer 150 includes a semiconductor material.

In some embodiments, the material layer 150 has different optical properties than photoresist. For example, the material layer 150 has a different n, k, or T value from photoresist. In some embodiments, the material layer 150 comprises at least one of different polymer structure, acid labile molecule, PAG (photo acid generator) loading, quencher loading, chromophore, cross linker, or solvent, which lead to different n value to photoresist. In some embodiments, the material layer 150 and photoresist have different etching resistance. In some embodiments, the material layer 150 contains an etching resistant molecule. The molecule includes low onishi number structure, double bond, triple bond, silicon, silicon nitride, Ti, TiN, Al, aluminum oxide, SiON, or combinations thereof. It is understood that the substrate 140 and the material layer 150 may each include additional suitable material compositions in other embodiments.

A photoresist layer 160 is formed over the substrate 140 (specifically, over the material layer 150). The photoresist layer 160 may be formed by a spin coating process 170. In the embodiment shown in FIG. 1, the photoresist layer 160 includes a positive photoresist, but it is understood that the photoresist layer 160 may include a negative photoresist in alternative embodiments. The photoresist layer 160 contains chemical components such as a polymer, photo acid generators (PAG), quenchers, chromophore, surfactant, cross linker, etc. In an embodiment, the photo acid generator is bonded to the polymer. In a subsequent photolithography process, photons induce decomposition of the PAG. As a result, a small amount of acid is formed, which further induces a cascade of chemical transformations in the photoresist layer 160. The quencher within the photoresist material helps improve critical dimension (CD) control.

It is understood that the chemical components (such as polymer, PAG, quenchers, chromophore, surfactant, cross linker) discussed above may be a small portion (e.g., between about 1% and 10%, for example about 5%) of the photoresist layer 160. A majority portion of the photoresist layer 160 is a solvent. In some embodiments, the solvent may include Propylene Glycol Monomethyl Ether (PGME), or Propylene Glycol Monomethyl Ether Acetate (PGMEA), or combinations thereof. The solvent may be mixed with the other chemical components (e.g., polymer) of the photoresist layer 160 in a bottle or another suitable container before the photoresist layer 160 is spin-coated or otherwise applied over the layer 150.

Figure 2:
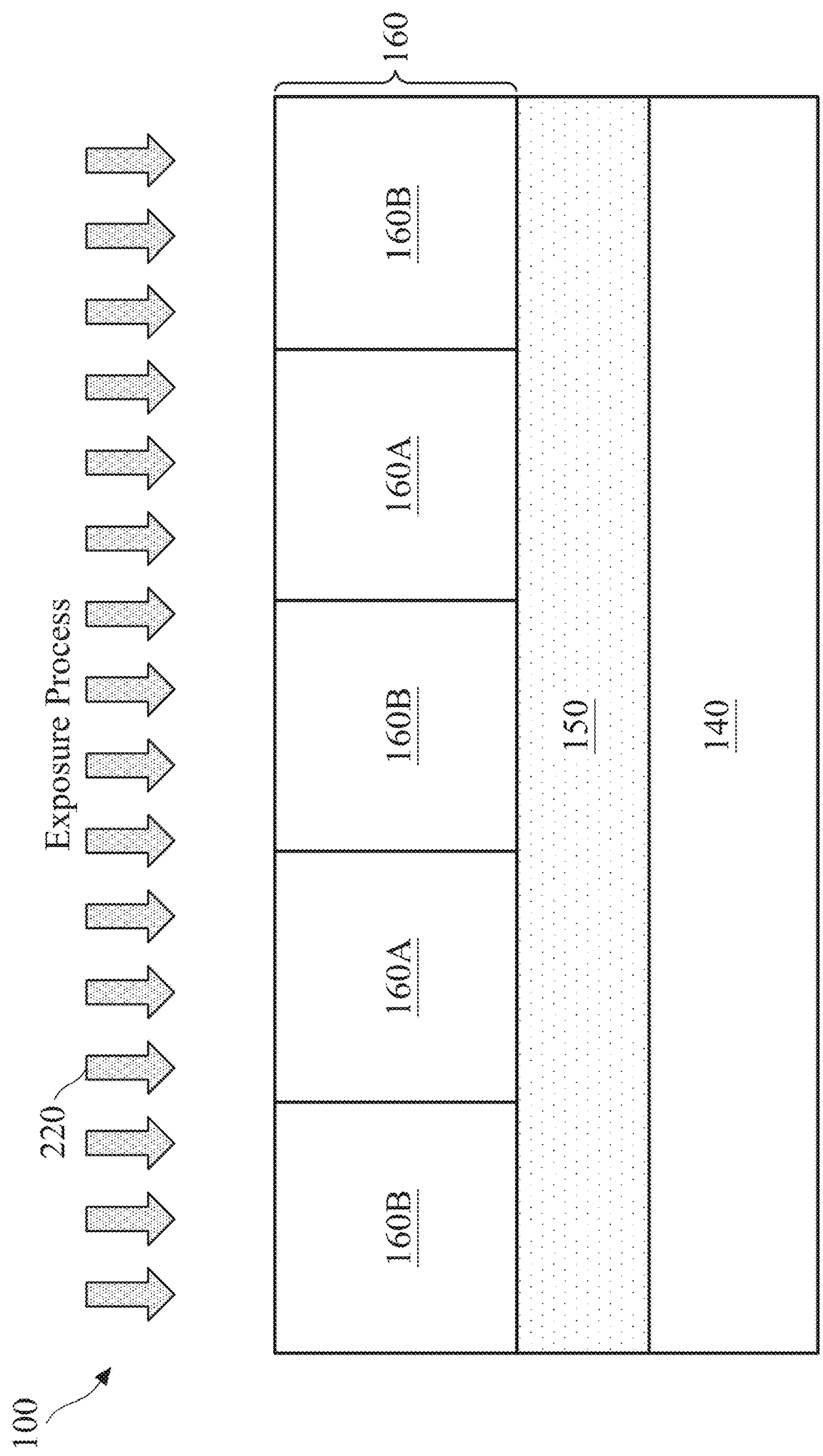

Referring now to FIG. 2, an exposure process 220 is performed to the semiconductor device 100. In the illustrated embodiment, the exposure 220 includes an exposure to extreme ultraviolet (EUV) radiation. For example, as a part of the exposure, a light source (or illumination source) is used that has a wavelength less than about 250 nm, for example about 13.5 nm in some embodiments. In some embodiments, the illumination source has at least one of: KrF, ArF, EUV, or E-beam. The light source exposes one or more predetermined regions 160A of the photoresist layer 160, while other regions 160B of the photoresist layer 160 are prevented from exposure through the use of a patterned lithography photomask, such as an EUV mask.

Figure 3:
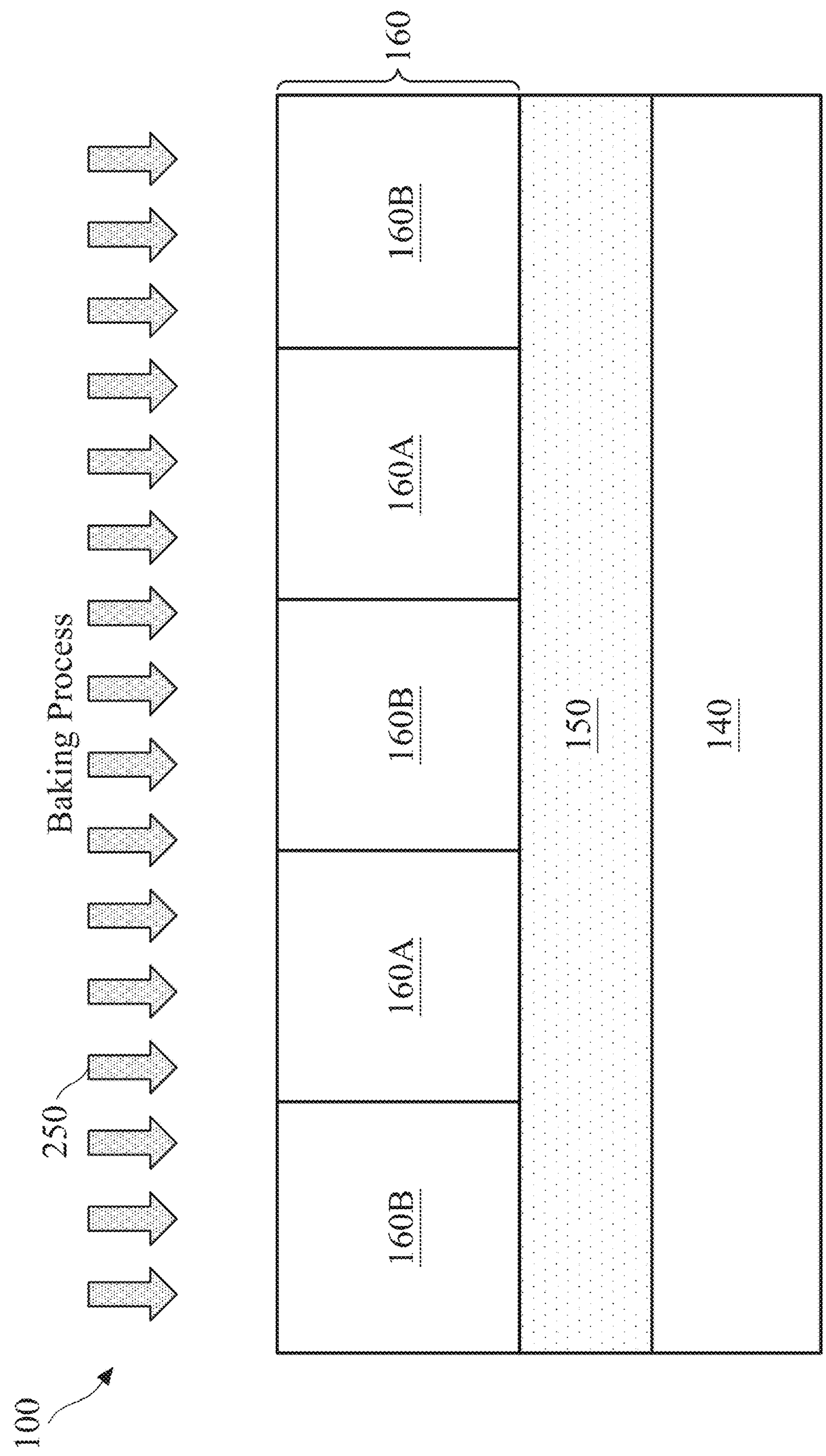

Referring now to FIG. 3, a baking process 250 is performed to the semiconductor device 100. Since this baking process 250 is performed after the exposure process 220 that exposes the photoresist layer 160, the baking process 250 may also be referred to as a post-exposure-baking (PEB) process. The baking process 250 may also be performed in a chamber using a hot plate, the details of which will be discussed below in more detail.

Figure 4:
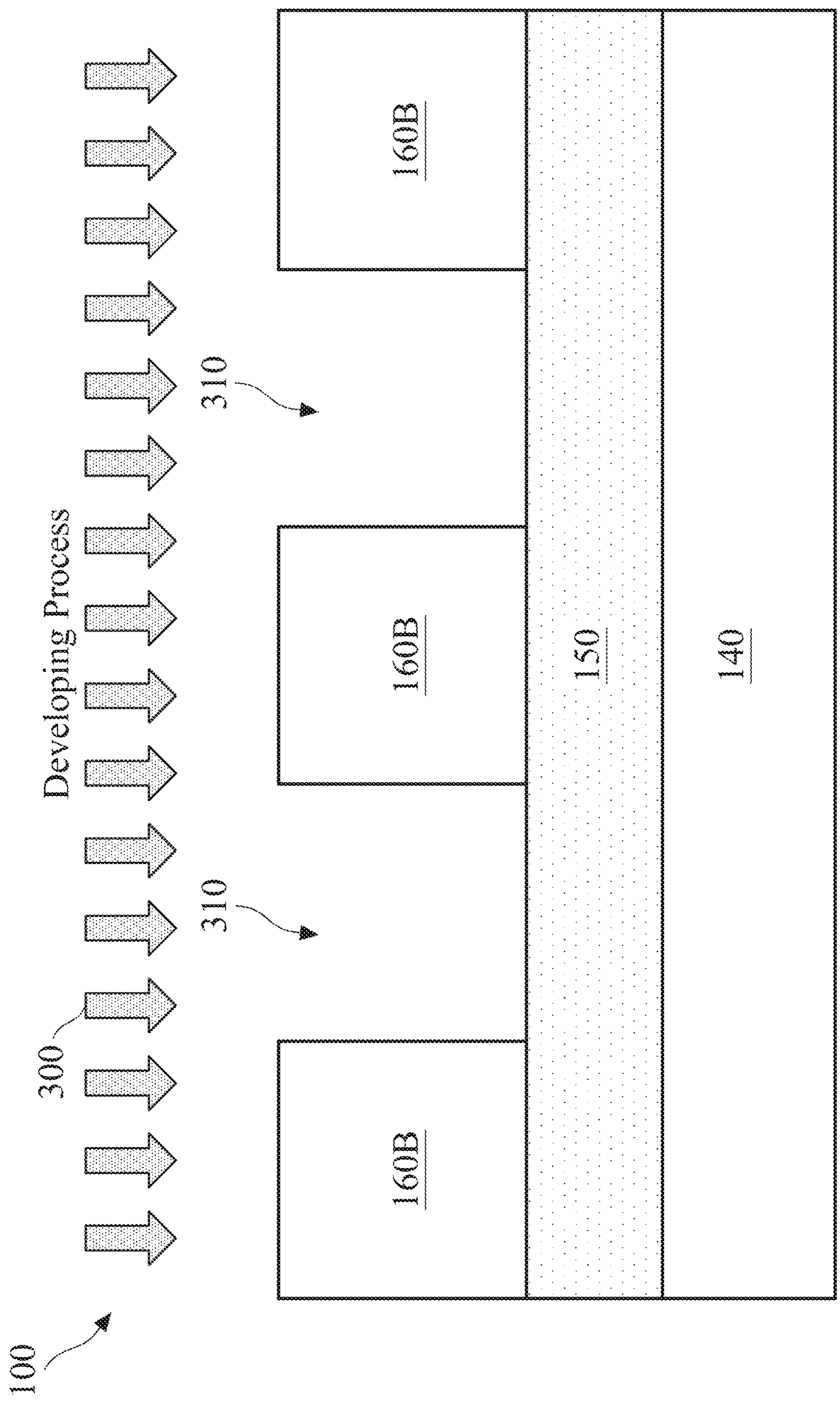

Referring now to FIG. 4, a developing process 300 is performed to the photoresist layer 160 after the baking process 250 is performed. The developing process 300 includes applying a developer solution to the photoresist layer 160, where the developer solution includes a solvent developer such as 2-heptanone, n-Butyl acetate (NBA), isoamyl acetate, or combinations thereof. The developing process 300 patterns the photoresist layer 160. Assuming a positive-tone photoresist is used, the exposed portions 160A of the photoresist layer 160 are removed after the developing process 300, as the exposure to the EUV light changes the chemical structure of the photoresist and makes it more soluble in the developer solution. Meanwhile, the unexposed portions 160B of the photoresist layer 160 remain, thereby forming openings 310 in place of the removed portions 160A. On the other hand, if the photoresist layer 160 had been a negative-tone photoresist, then the exposed portions 160A would have remained after the developing process 300, while the unexposed portions 160B would have been removed. In any case, the pattern photoresist layer 160 can now be used to pattern the material layer 150 therebelow in subsequent fabrication processes.

Figure 5:
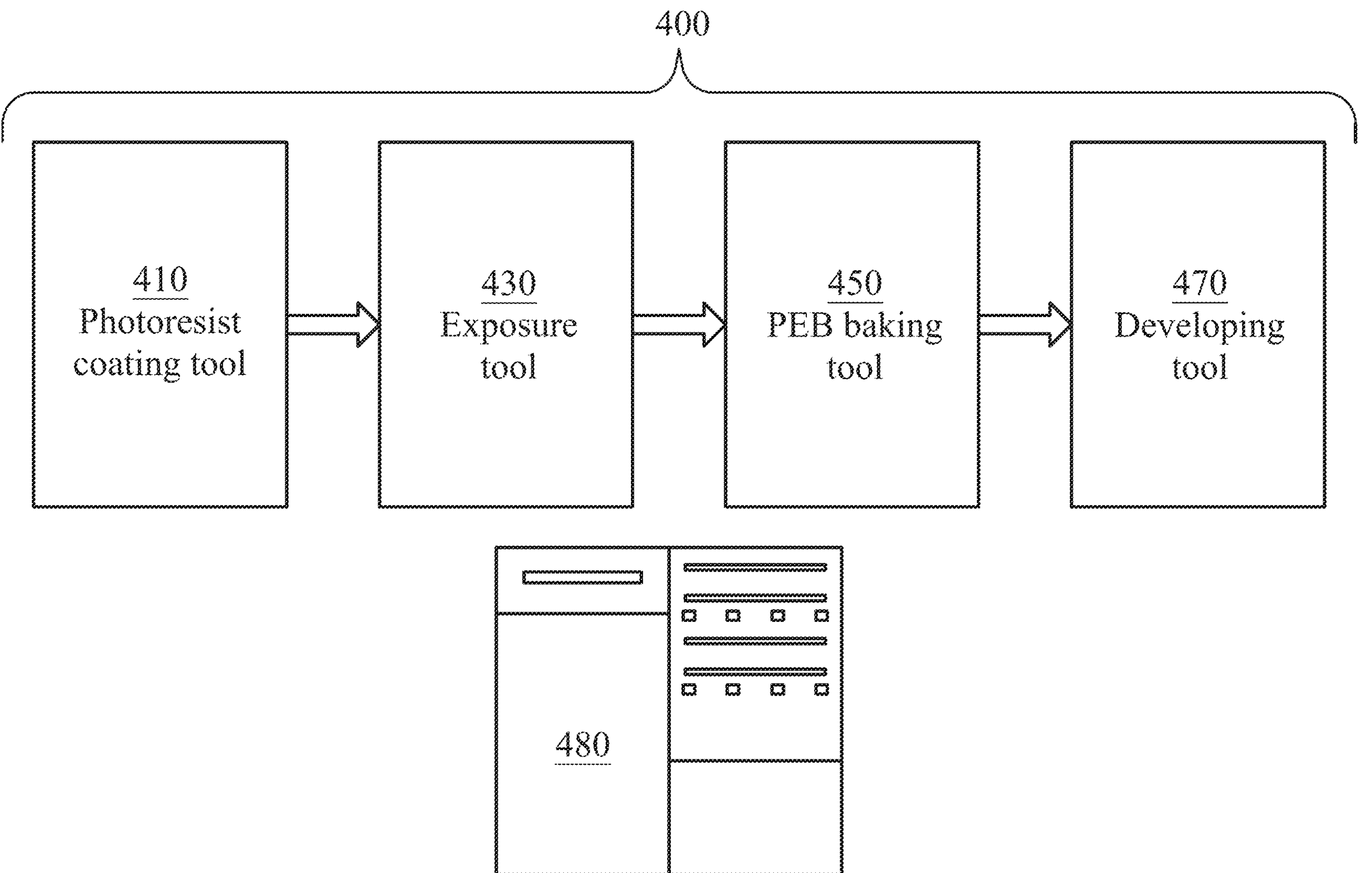
FIG. 5 is a diagrammatic view of a system for fabrication a semiconductor device in accordance with some embodiments of the present disclosure.

FIG. 5 is a simplified diagrammatic view of a portion of a semiconductor fabrication system 400 that may be used to perform the various fabrication processes discussed above with reference to FIGS. 1-4. The arrows shown in FIG. 5 indicate the sequential order in which the semiconductor fabrication processes are performed using the various tools of the system 400.

The fabrication system 400 includes a photoresist coating tool 410. The photoresist coating tool 410 may be used to coat the photoresist layer 160 over the layer 150 as a part of the spin coating process 170 discussed above with reference to FIG. 1. In some embodiments, the photoresist coating tool 410 includes a bottle or container for mixing the photoresist chemicals (e.g., polymer, PAG, etc.) with a solvent. The photoresist coating tool 410 may also include nozzles for spraying liquids, such as the mixture that is made up of the photoresist chemicals and the solvent. The photoresist coating tool 410 may also include a stage for holding and/or spinning a wafer while the photoresist layer 160 is coated thereon.

The fabrication system 400 includes an exposure tool 430. The exposure tool 430 may be used to expose the photoresist layer 160 as a part of the exposure process 220 discussed above with reference to FIG. 2. In some embodiments, the exposure tool 430 includes an EUV scanner. Other types of scanners may also be used in alternative embodiments.

The fabrication system 400 includes a post-exposure baking (PEB) tool 450. The PEB tool 420 may be used to bake the photoresist layer 160 as a part of the baking process 250 discussed above with reference to FIG. 3. In some embodiments, the baking tool 450 includes a "hot plate"—which is a heated plate—as a part of a track semiconductor fabrication system. As discussed above, heat uniformity during the PEB process may have significant impacts on the device performance, such as critical dimension uniformity. Therefore, the present disclosure utilizes a cumulative amount of thermal energy to determine whether a particular PEB tool (e.g., a hot plate) should be qualified as usable in actual semiconductor fabrication, for example being used in the PEB process. This will be discussed below in more detail.

The fabrication system 400 includes a developing tool 470. The developing tool 470 may be used to develop the photoresist layer 160 as a part of the developing process 300 discussed above with reference to FIG. 4. In some embodiments, the developing tool 470 includes nozzles or other dispensing units that are configured to dispense the developer solution.

The fabrication system 400 also includes a controller 480. The controller 480 includes programming instructions for operating one or more of the tools 410-470. The controller 480 may be a standalone controller in some embodiments, or it may be integrated into one or more of the tools 410-470 in other embodiments. It is understood that the fabrication system 400 may include one or more tools in addition to the tools 410-470 discussed above. These additional tools may be used to perform other step of the semiconductor fabrication before, during, or after the steps performed by the tools 410-470. For reasons of simplicity, however, these additional tools are not discussed in detail herein.

Figure 6A:
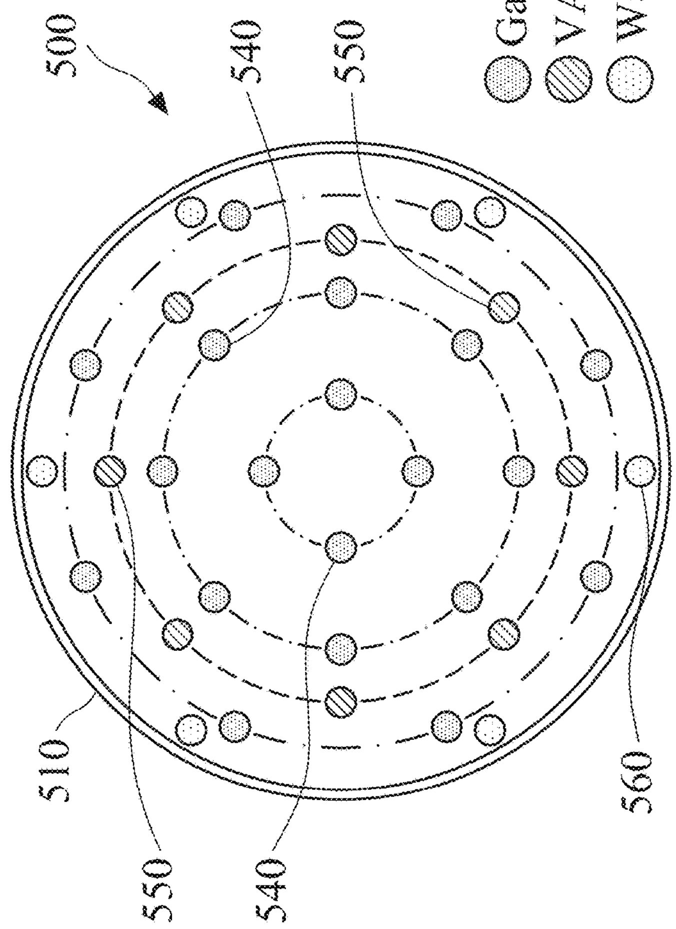
FIG. 6A is a diagrammatic top view of a baking module in accordance with some embodiments of the present disclosure.
Figure 6B:
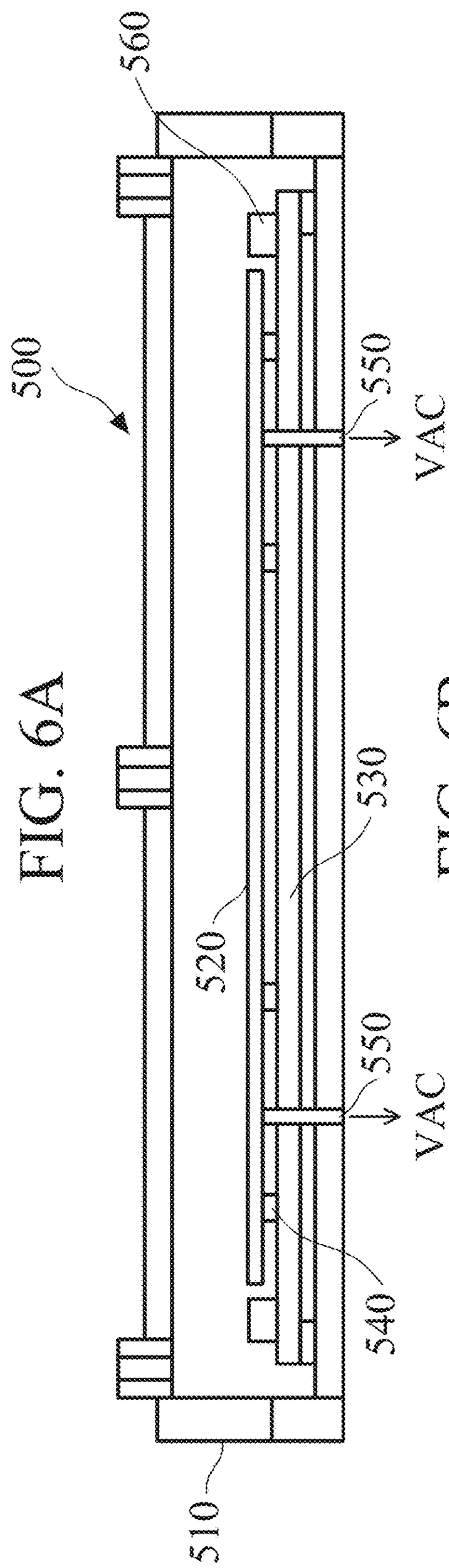
FIG. 6B is a diagrammatic cross-sectional side view of the baking module of FIG. 6A in accordance with some embodiments of the present disclosure.

FIG. 6A is a diagrammatic top view of a baking module 500, and FIG. 6B is a diagrammatic cross-sectional side view of the baking module 500 according to embodiments of the present disclosure. The baking module 500 is a part of the PEB baking tool 450 discussed above and may be used to perform PEB processes, as well as other processes involving thermal heating. The baking module 500 includes an enclosure 510, which may include a sealable chamber. A wafer 520 (e.g., a production wafer or a test wafer) may be placed inside the baking module 500 and thermally heated. In the embodiment illustrated in FIG. 6B, the wafer 520 includes a test wafer, which is used to measure temperature data associated with the baking module 500 in a baking process. The temperature data will then be used to determine whether the baking module should be qualified as being ready for actual semiconductor fabrication, as discussed below in more detail.

Still referring to FIG. 6B, the baking module 500 generates heat or thermal energy via a hot plate 530 that is placed underneath the wafer 520. In some embodiments, the hot plate 530 includes a ceramic material and may be several inches (or tens of inches) thick. The thermal energy may be generated using electrical resistance heating, where electrical energy is converted into thermal energy by running an electrical current through one or more resistors embedded in the hot plate 530 or near it. The resistance of the resistors and/or the amount of electrical current may be adjusted to change the amount of heat produced by the baking module 500, and therefore the temperature inside the baking module 500. The temperature adjustment for the baking module 500 may be controlled by an internal or external controller, such as the controller 480 of FIG. 5 discussed above.

A plurality of gap pins 540 are implemented on the hot plate 530. These gap pins 540 separate the wafer 520 from the hot plate 530, so that the wafer 520 is not in direct physical contact with the top surface of the hot plate 530. In this manner, the thermal energy generated by the hot plate 530 may radiate more evenly throughout the surfaces of the wafer 520, rather than being concentrated in certain spots of the wafer 520. A height of the gap pins 540 determines (or is substantially equal to) a distance separating the wafer 520 and the hot plate 530. In some embodiments, the height of the gap pins 540 (or the distance separating the wafer 520 and the hot plate 530) is in a range from about 50 microns and about 200 microns, for example about 100 microns. The location of the gap pins 540 are illustrated more clearly in the top view of FIG. 6A according to an embodiment of the present disclosure.

In order to secure the wafer 520 onto the hot plate 530, vacuum holes 550 are implemented in the hot plate 530. The vacuum holes 550 each extend vertically through the hot plate 530. The vacuum holes 550 may also provide an external outlet for the baking module 500. In this manner, the region underneath the wafer 520 may be in fluid communication with devices external to the baking module 500, such as a vacuum pump. The vacuum pump may suck air out of the region underneath the wafer 520, thereby creating a partial vacuum underneath the wafer 520. The partial vacuum ensures that the wafer 520 can be secured to the hot plate 530 and prevents inadvertent or unintentional movement of the wafer 520. The location of the vacuum holes 550 are also illustrated more clearly in the top view of FIG. 6A according to an embodiment of the present disclosure.

The baking module 500 further includes wafer guides 560, six of which are illustrated in the embodiment shown in FIG. 6A. The wafer guides 560 are located around the edges of the hot plate 530 and prevent the wafer 520 from slipping out of the baking module 500. In other words, the wafer guides 560 restrict the possible movement of the wafer 520 beyond the wafer guides 560, since the sidewalls of the wafer 520 would come into contact with the wafer guides 560. The wafer guides 560 also help define or limit the wafer baking areas.

Figure 7:
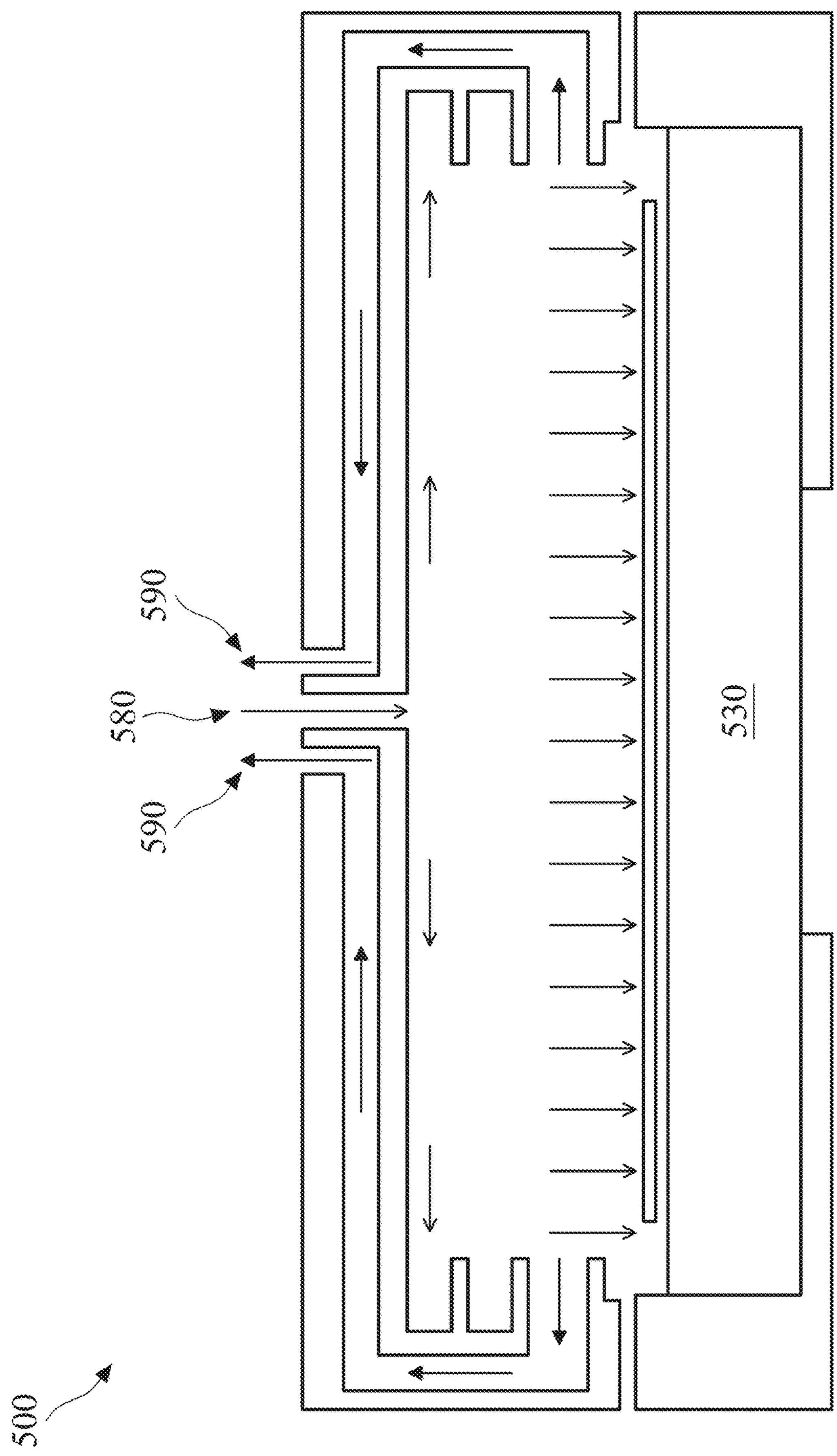
FIG. 7 illustrates a simplified diagrammatic cross-sectional side view of the baking module of FIGS. 6A-6B that shows a movement of air inside the baking module in accordance with some embodiments of the present disclosure.

FIG. 7 illustrates a simplified diagrammatic cross-sectional side view of the baking module 500 that shows a movement of air inside the baking module. The movement of air illustrates how an exhaust component of the baking module 500 functions to remove undesired materials from the baking module 500. For example, the air movement directions are illustrated by a plurality of arrows in FIG. 7. As is shown in FIG. 7, air is pushed into the baking module 500 through one or more inlets 580 at the "top" of the baking module 500. The air then travels downwards and sideways, and then gets sucked back up (along with the contaminant particles) and out of the baking module 500 through one or more outlets 590, which are also located at the "top" of the baking module 500 in the illustrated embodiment. During the baking process, various contaminants such as chemical particles may be produced (e.g., evaporation from the developer solution). It is undesirable for these contaminant particles to remain inside the baking module 500. Therefore, the operation of the exhaust component (which may include one or more fans) effectively removes the contaminants from the baking module 500 via the flow of the air.

Figure 8:
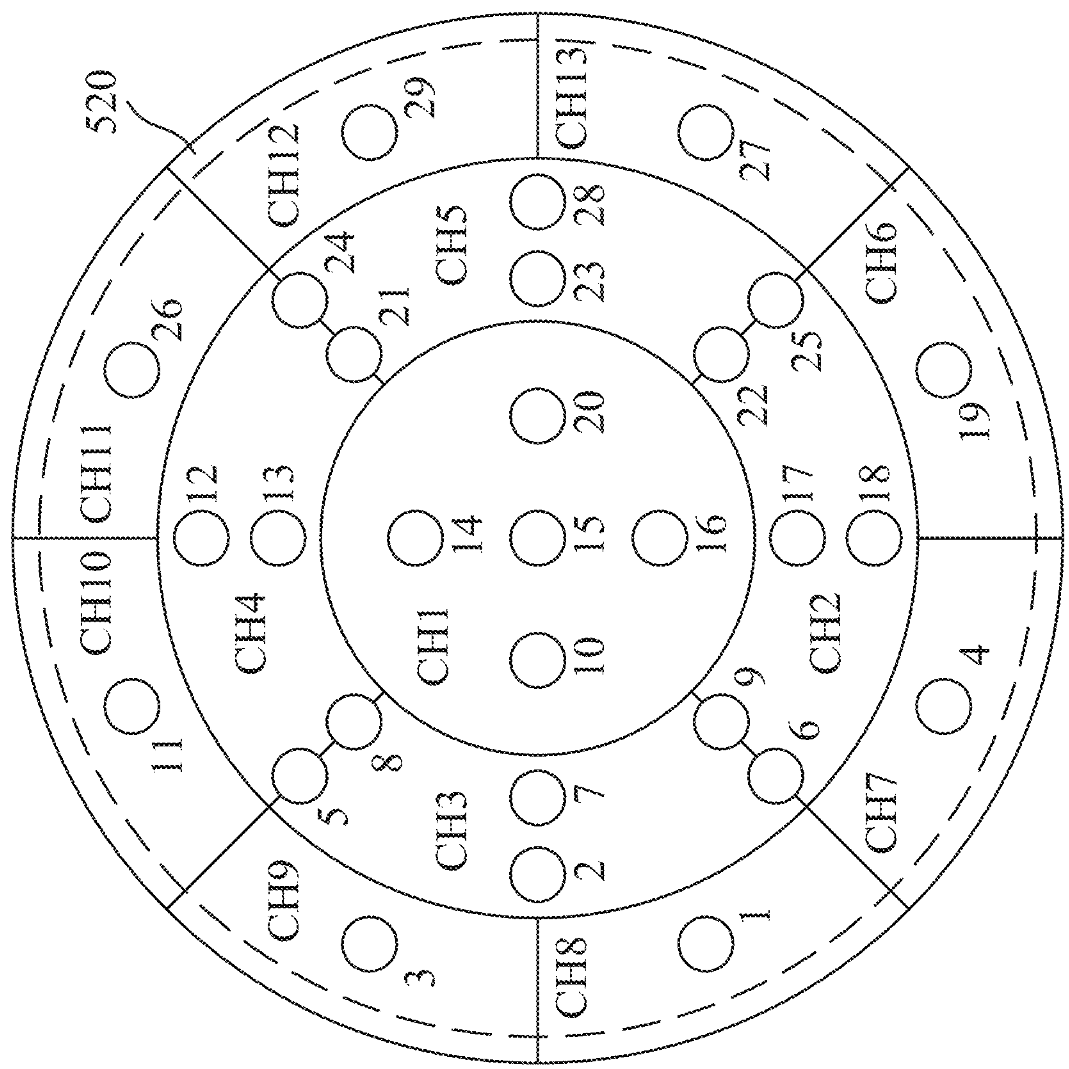
FIG. 8 illustrates a superimposed diagrammatic top view of the baking module of FIGS. 6A-B and a plurality of sensors on a test wafer in accordance with some embodiments of the present disclosure.

FIG. 8 illustrates a superimposed diagrammatic top view of the hot plate 530 and a plurality of sensors of the wafer 520. The outline or boundary of the wafer 520 is shown in FIG. 8 as broken lines. As discussed above, the wafer 520 is a test wafer and not a production wafer, and thus sensors may be placed on the wafer 520 without concerns of damaging the circuitry therein. In the embodiment illustrated in FIG. 8, a plurality of heat sensors 1-29 (e.g., sensors for measuring temperature) are placed on the wafer 520, so that the wafer heat sensors 1-29 can measure the temperature experienced by the portions of the wafer corresponding to the locations of the wafer heat sensors 1-29. Meanwhile, the hot plate 530 includes a plurality of heater channels, for example channels CH1-CH13 in the embodiment illustrated in FIG. 8. The channels CH1-CH13 each correspond to a region or zone of the hot plate 530 where heat can be individually and/or independently applied.

Each of the channels CH1-CH13 may be associated with one or more of the wafer heat sensors 1-29. In other words, one or more wafer heat sensors 1-29 are placed in a region of the wafer 520 that is overlying each of the channels CH1-CH13. For example, channel CH1 is associated with the wafer heat sensors 10, 14, 15, 16, and 20, channel CH2 is associated with the wafer heat sensors 17, 18, 6, 9, 22, and 25, channel CH3 is associated with the wafer heat sensors 2, 7, 5, 6, 8, and 9, etc. Table 1 below lists the channel numbers and their respectively associated wafer heat sensors.

TABLE 1

| Channel Number | Wafer Heat Sensor Number |
|---|---|
| CH1 | 10, 14, 15, 16, 20 |
| CH2 | 17, 18, (6, 9, 22, 25) |
| CH3 | 2, 7, (5, 6, 8, 9) |
| CH4 | 12, 13, (5, 8, 21, 24) |
| CH5 | 23, 28, (21, 22, 24, 25) |
| CH6 | 19 |
| CH7 | 4 |
| CH8 | 1 |
| CH9 | 3 |
| CH10 | 11 |
| CH11 | 26 |
| CH12 | 29 |
| CH13 | 27 |

Note that some of the wafer heat sensors 1-29 are "shared" among multiple channels. For example, the wafer heat sensor 6 is "shared" between the channels CH2 and CH3, since it is actually located "in between" the channels CH2 and CH3. As another example, the wafer heat sensor 25 is "shared" between the channels CH2 and CH5, since it is actually located "in between" the channels CH2 and CH5. These shared wafer heat sensors are shown in Table 1 as being in parentheses. For example, channel CH2 is associated with the wafer heat sensors 17, 18, 6, 9, 22, and 25, where the wafer heat sensors 17 and 18 are associated with channel CH2 and no other channels, but the wafer heat sensors 6, 9, 22, and 25 are each "shared" between channel CH2 and one or more other channels.

It is understood that the configuration of the channels and the wafer heat sensors described above merely provides an example. In alternative embodiments, there may be a different number of channels and/or a different number of wafer heat sensors, and their respective locations may be different as well.

Before the hot plate 530 can be used in actual semiconductor fabrication, it needs to undergo a qualification process. Various tests and measurements are performed using the hot plate 530 to determine whether the hot plate 530 can generate heat uniformly across its different regions (e.g., the channels CH1-CH13). According to the various aspects of the present disclosure, rather than a single measurement of temperature, a cumulative heat amount (or amount of heat) is used to determine whether the hot plate 530 (or the baking module 500) should be qualified to be used in actual semiconductor fabrication.

Figure 9:
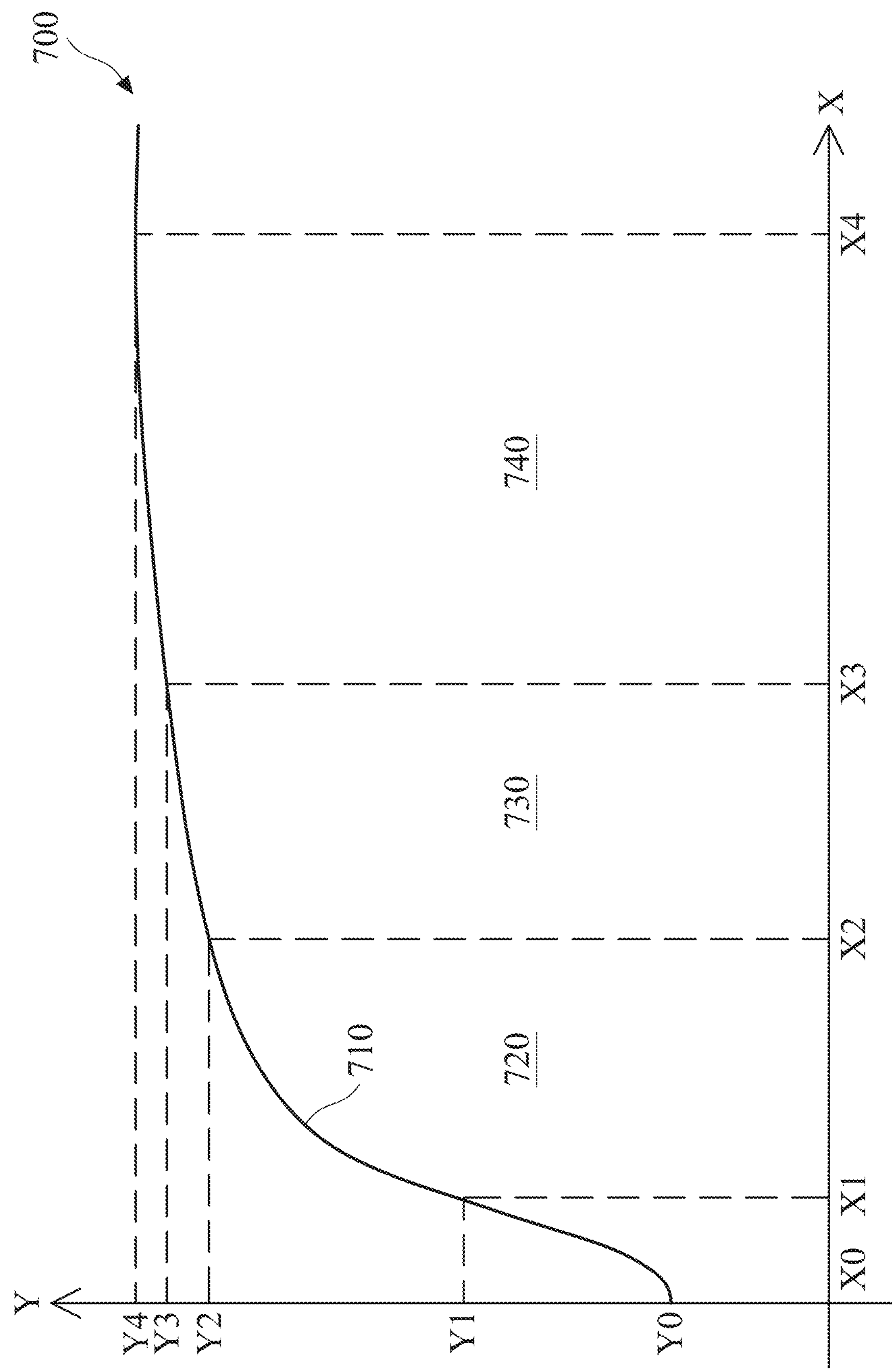
FIG. 9 illustrates a graph of temperature versus time in accordance with some embodiments of the present disclosure.

For example, referring now to FIG. 9, a graph 700 is illustrated. The graph 700 includes a plot 710 of temperature versus time. In other words, the X-axis in FIG. 9 represents time, for example with a unit of seconds, and the Y-axis in FIG. 9 represents temperature, for example with a unit of degrees Celsius. The origin (e.g., the intersection of the X-axis and the Y-axis) corresponds to a time of 0 seconds and a temperature of 0 degrees Celsius.

The plot 710 represents the temperatures measured by one or more of the wafer heat sensors 1-29 and/or the channels CH1-CH13 discussed above over a period of time. For example, the plot 710 includes a ramp up region 720 where the temperature is being ramped up (e.g., by the baking module 500), a static region 730 where the temperature is beginning to reach a plateau (or a static level), and a region 740 where the temperature mostly stays at the static level. It is understood, however, that the shape of the plot 710 is just a non-limiting example, and that the regions 720-740 may be defined differently in other embodiments as well.

In more detail, at a time of X0, the wafer 520 has an initial temperature Y0, which may be a room temperature (e.g., about 25 degrees Celsius) in some embodiments. At some time after X0, the temperature of the wafer 520 begins to get ramped up, due to the heat generated by the hot plate 530. At a time of X1, the temperature reaches Y1, which in the illustrated embodiment is defined as a target static temperature (e.g., Y4 in the illustrated embodiment) minus 30 degrees Celsius. For example, suppose the target static temperature Y4—the temperature that the wafer is supposed to be ramped up to—is set to be 88 degrees Celsius, then the temperature Y1 is equal to 88−30=58 degrees Celsius. As such, as soon as the wafer heat sensor detects that the wafer temperature has reached 58 degrees Celsius, the corresponding time is recorded, which is X1. X1 and Y1 marks the beginning of the ramp up region 720. It is understood that the target static temperature of 88 degrees Celsius and the 30 degrees Celsius temperature difference between the target static temperature and the temperature X1 are merely examples, and their respective values may change in alternative embodiments.

As the temperature continues to get ramped up inside the baking module 500, at a predefined time X2 after the time X1, the temperature reaches a level Y2. In some embodiments, X2 is defined to be 34.5 seconds after X1, though it is understood that this value may change in alternative embodiments. The temperature Y2 is greater than the temperature Y1 but may be less than (although close to) the target static temperature Y4. X2 and Y2 mark the end of the ramp-up region 720, as well as the beginning of the static region 730.

At a time X3, the wafer 520 reaches a temperature of Y3. In some embodiments, the temperature Y3 is equal to the target static temperature Y4 or is different from Y4 by a negligible amount (e.g., less than a degree Celsius). X3 and Y3 mark the end of the static region 730 and the beginning of the region 740.

As discussed above, the present disclosure determines a cumulative amount of heat experienced by the wafer, rather than a single temperature reading itself, to determine whether the baking module 500 provides sufficient temperature uniformity. One way to express the cumulative heat amount is by taking an integral of the plot 710 at its various regions, such as in the ramp-up region 720 and in the static region 730. In other words, an area under the curve (i.e., under the plot 710) in the ramp-up region 720 may be determined, and another area under the curve in the static region 730 may be determined. For purposes of simplicity, a plurality of data samples (regarding the wafer temperature) may be taken by the wafer hear sensors 1-29, and the temperatures measured by each wafer heat sensor may be summed together for each of the regions 720 and 730, to represent or approximate the integral values associated with each of the regions 720 and 730.

To facilitate the ensuing discussions, the temperature data points for two different hot plates 1 and 2 are shown in FIGS. 10A-10B and FIGS. 11A-11B, respectively. In more detail, FIGS. 10A-10B illustrates a table 810 and a table 811, which include data for the hot plate 1, and FIGS. 11A-11B illustrates a table 820 and a table 821, which include data for the hot plate 2. Both hot plate 1 and hot plate 2 are embodiments of the hot plate 530 discussed above, though they belong to two different actual baking modules.

Referring to FIGS. 10A-10B, the table 810 includes the accumulated (e.g., sum) wafer temperatures measured by each wafer heat sensor 1-29 (e.g., the rows corresponding to RTD1-RTD29, respectively) in both the ramp-up region 720 (under the "ramp" column) and the static region 730 (under the "static" column). In some embodiments, the temperature data is measured by the wafer heat sensors 1-29 at every 0.5 seconds. However, the 0.5 second interval is merely an example and may be another value (e.g., 0.1 seconds, or 1 second) in other embodiments. From the beginning time X1 to the end time X2 of the ramp-up region 720, a plurality of data samples are taken regarding the measured wafer temperature. These data samples are summed together, for each wafer heat sensor 1-29, to arrive at the accumulated temperature values in the "ramp" column of table 810. Similarly, the accumulated temperature values are obtained for the "static" column by summing the data samples together from the time X2 to the time X3.

For example, for the wafer heat sensor 1 (i.e., RTD1), the temperatures measured at every 0.5 seconds are summed together from the time X1 to the time X2 (i.e., from the beginning to the end of the ramp-up region 720), and the resulting value is 5030.92100, as shown in the table 810. For the same wafer hear sensor 1, the temperatures measured at every 0.5 seconds are summed together from the time X2 to the time X3, and the resulting value is 4224.44400. As such, the value 5030.92100 represents the total amount of heat experienced by the wafer heat sensor 1 in the ramp-up region 720, and the value 4224.44400 represents the total amount of heat experienced by the wafer heat sensor 1 in the static region 730. In other words, the values 5030.92100 and 4224.44400 represent the area under the curve (or the integral) for the plot 710 for the ramp-up region 720 and the static region 730, respectively. The rest of the table 810 is populated by repeating the same steps for each of the wafer heat sensors 1-29. It is understood that one of the reasons for taking a plurality of samples to approximate the integral—rather than performing the actual integral calculation directly—is due to real world hardware and software constraints. An actual integral calculation may require an infinite number of temperature samples, which is unrealistic in the semiconductor fabrication context. Taking more samples (e.g., taking samples at shorter time intervals, such as every 0.1 second or even every 0.05 seconds) may allow the calculations herein to better approximate the actual integral calculation, but at the expense of a slower process time. According to the various aspects of the present disclosure, taking samples at every 0.5 seconds allows the process discussed above to be performed relatively quickly, while also resembling the integral calculations close enough. However, it is understood that in alternative embodiments, the 0.5 second interval may be adjusted, depending on the particular needs. For example, when more accurate data is needed but the process time is not a concern, the 0.5 second interval may be lowered. Conversely, when the process needs to be performed more quickly but a high accuracy is not as important, the 0.5 second interval may be increased.

After the table 810 is generated, a standard deviation may be calculated for all the cumulative heat amount data corresponding to the wafer heat sensors 1-29 in the ramp-up region 720. In some embodiments, a three-sigma (e.g., three standard deviations) value is calculated, which in the illustrated embodiment is 4.539033666. An average value (e.g., the sum of the values in the "static" column divided by 29) is also calculated for all wafer heat sensors 1-29 in the static region 730, which in the illustrated embodiment is calculated to be 4224.57169. These values will be used later to determine whether to qualify the hot plate 1, as will be discussed in more detail below.

Still referring to FIGS. 10A-10B, the table 811 is generated similarly as the table 810, with one difference: whereas the rows in the table 810 correspond to the data samples for individual wafer heat sensors 1-29, the rows in the table 811 correspond to the data samples for the channels CH1-CH13. As discussed above, each of the channels CH1-CH13 (labeled as CH1-CH13 in table 811) is associated with one or more wafer heat sensors 1-29. As such, the data for each channel may be calculated by averaging the data for all of its associated wafer heat sensors-. As an example, channel CH1 is associated with the wafer heat sensors 10, 14, 15, 16, and 20. As shown in table 810, the measured data for the wafer heat sensors 10, 14, 15, 16, and 20 are 5034.437, 5035.672, 5033.15, 5031.554, and 5033.64, respectively. These values are added together and divided by 5 (since there are 5 sensors), which yields the result of 5033.69060 for the accumulated temperature for channel CH1 in table 811. This value of 5033.69060 is for the ramp-up region 720, and the same steps may be performed for the static region 730 to arrive at the value 4224.70320. For channels that do not have multiple associated wafer heat sensors, their values in table 811 are the same as the values in table 810 for the corresponding wafer heat sensor. For example, channel CH13 is associated with just the wafer sensor 27. As such, the values for the channel CH13 in table 811 are the same as the values for the wafer heat sensor 27 in table 810. In this manner, the rest of the table 811 is populated.

As discussed above, the measured data samples shown in tables 810 and 811 represent cumulative thermal energy experienced by the wafer 520 and delivered by the hot plate 1. The cumulative thermal energy is then compared with one or more predefined thresholds to determine whether the hot plate 1 should be qualified as a production-ready hot plate. For example, one predefined threshold pertains to a range variation of the cumulative thermal energy experienced by the channels CH1-CH13 in the ramp-up region. As shown in table 811, this range variation can be calculated as a maximum cumulative thermal energy (corresponding to channel CH10) minus the minimum cumulative thermal energy (corresponding to channel CH4). The difference is calculated as 2.90650. In one embodiment, the predefined threshold is 10. Thus, the hot plate 1 passes this predefined threshold, since the range variation of the cumulative thermal energy experienced by the channels CH1-CH13 in the ramp-up region is 2.90650, which is less than 10. For hot plates that have range variations greater than 10, they are deemed to have failed the hot plate qualification test.

Another predefined threshold pertains to the three-sigma value of the cumulative thermal energy in the ramp up region. As shown in table 810, the calculated three-sigma value is 4.539033666. The predefined threshold may be defined as 10. As such, the hot plate 1 passes this test, since its three-sigma value of 4.539033666 is less than 10. However, for hot plates whose corresponding three-sigma values are greater than 10, they are deemed to have failed the hot plate qualification test.

Yet another predefined threshold pertains to the variations among the cumulative thermal energy in the static region for different hot plates. Referring to FIGS. 11A-11B, the tables 820 and 821 are generated in the same way as the tables 810-811, respectively, except that the data points are taken from a different hot plate 2, whereas the data points in tables 810-811 are taken from the hot plate 1. Even though the hot plates 1 and 2 are designed and configured to be substantially the same, slight differences may still exist between them. As such, the values in tables 810-811 may be slightly different than the values in tables 820-821. As shown in tables 810 and 820, the average cumulative thermal energy for the static region is 4224.57169 for hot plate 1 and 4225.02000 for hot plate 2. The difference between them is calculated to be 0.44831. The predefined threshold may be defined as 1.65. As such, the hot plates 1 and 2 pass this test, since their difference of 0.44831 is less than 1.65. However, for hot plates whose differences in cumulative thermal energy are greater than 1.65, they are deemed to have failed the hot plate qualification test.

It is understood that the values of these predefined thresholds discussed above are merely non-limiting examples, and that other suitable values may be used in alternative embodiments. For example, if stricter qualification standards are needed, then the predefined threshold of 10 for the range variation discussed above may be lowered to 3 in some embodiments. Furthermore, the algorithms used to calculate the cumulative thermal energies discussed above are also non-limiting examples. In addition, the same tests may be done for the ramp-up region 720 as for the static region 730. Furthermore, it is understood that the qualification of the baking modules may involve passing one or more, but not necessarily all, of the tests discussed above (or other additional tests pertaining to the cumulative amount of thermal energy). It is also understood that the tests regarding the cumulative amount of thermal energy may be repeated for regions other than the ramp-up region 720 or the static region 730, for example for the region 740. Regardless of how the exact qualification testing for the baking module is performed, it is understood that the qualification testing is done using the cumulative amount of heat or thermal energy, rather than just a single measurement of temperature. As such, the present disclosure can offer a more accurate assessment of the heat uniformity performance of the baking modules.

Figure 12:
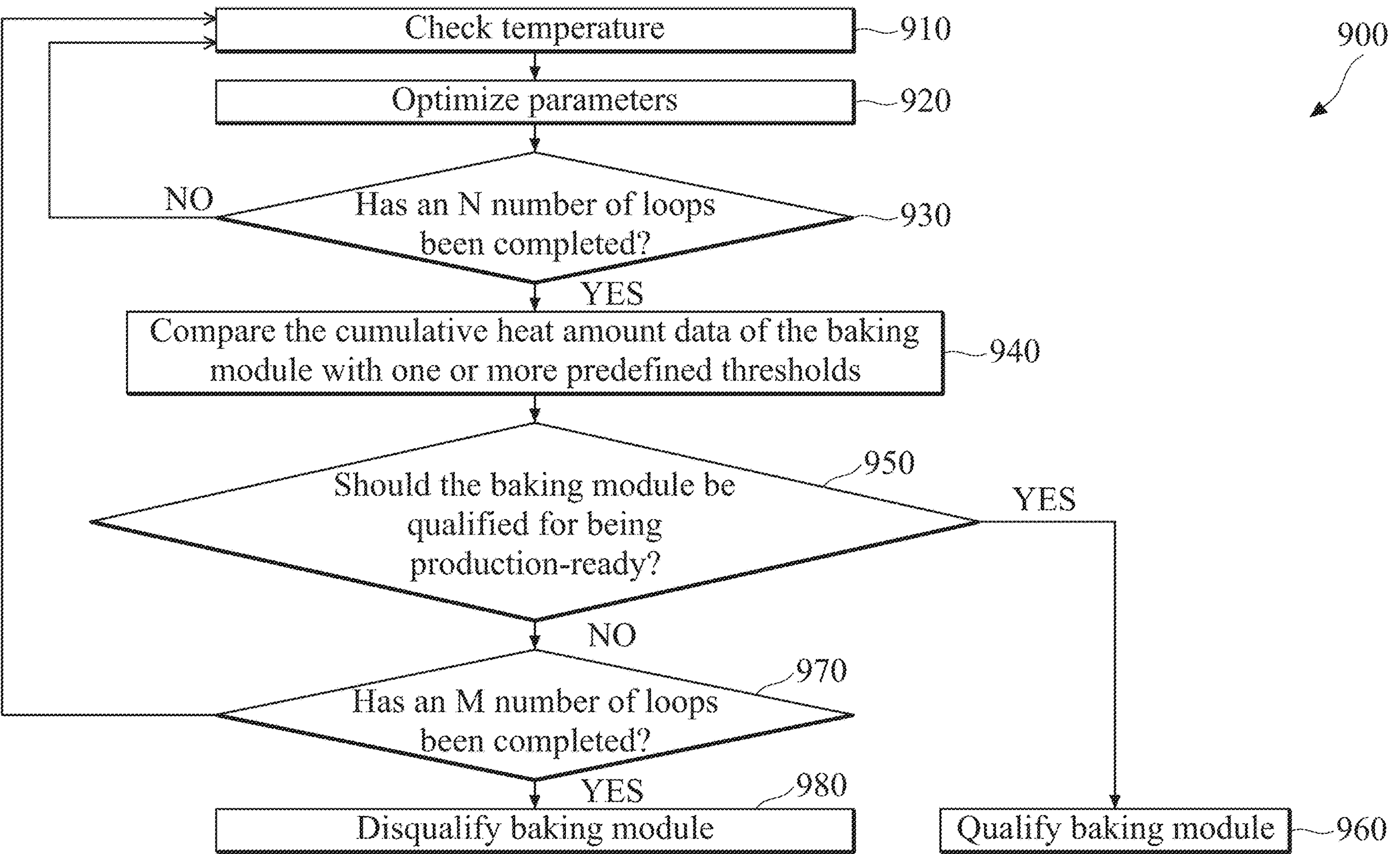
FIG. 12 is a flowchart of a method of performing qualification testing of a baking module in accordance with some embodiments of the present disclosure.

FIG. 12 is a flowchart illustrating a method 900 of performing qualification testing for the baking module 500. In various embodiments, one or more steps of the method 900 may be performed at least in part using a controller such as the controller 480 of FIG. 5.

The method 900 includes a step 910 to check temperatures, for example using the heat sensors 1-29 discussed above to measure temperatures. The sensors may be implemented on a test wafer such as the wafer 520. The temperatures may be measured as the baking module 500 is ramping up the temperatures (e.g., in the ramp-up region 720), or as the temperature has mostly reached a steady state (e.g., in the static region 730 or 740).

The method 900 includes a step 920 to optimize the operation parameters. The operation parameters may be the parameters of the baking module, which can be controlled or optimized by the controller 480 discussed above. In some embodiments, the optimization of the parameters may include changing the settings of one or more of the channels CH1-CH13 to adjust the amount of heat generated by that channel. For example, the temperatures measured by the heat sensors associated with channel CH1 may be substantially greater than the temperatures measured by the heat sensors for the rest of the channels. This may indicate that channel CH1 is generating too much heat. To ensure temperature uniformity, the step 920 may adjust the settings of the baking module 500 such that channel CH1 is generating less heat than before.

The method 900 includes a step 930 to determine whether an N number of loops has been completed. The performance of the steps 910 and 920 may be considered as one loop. In some embodiments, N is equal to 3. Other values for N may be used in alternative embodiments. If the answer from the determination step 930 is no, then the method 900 returns back to step 910 to repeat at least one more loop of the steps 910 and 920.

If the answer from the determination step 930 is yes, then the method 900 proceeds to a step 940 to compare the cumulative heat amount data of the baking module with one or more predefined thresholds. As discussed above, the present disclosure uses a cumulative amount of heat as a gauge for the heat uniformity performance of the baking module, which is more accurate than merely measuring a temperature. In various embodiments, the measurement of the cumulative amount of heat and the comparison with the predefined thresholds may be performed in accordance with the algorithms discussed above with reference to FIGS. 9-11.

Based on the results of the step 940, the method 900 performs a step 950 to determine whether the baking module should be qualified for being production-ready. For example, if the comparison indicates that the measured cumulative heat amount data fails the predefined threshold (e.g., exceeds the predefined threshold when it should be below it), then the baking module is deemed to fail the qualification, and that additional steps need to be taken before the baking module can be qualified. The steps 940-950 may collectively be referred to as a "judging" step, since these steps "judge" whether the baking module is ready to be used for actual semiconductor fabrication.

Note that in some embodiments, the qualification here pertains to the PEB process, not to other baking or thermal heating processes. In other words, the baking module herein may be qualified for being usable in non-PEB thermal heating processes in actual fabrication, since these thermal heating processes may not demand as stringent heating uniformity as the PEB process. Therefore, the qualification standards for qualifying a baking module to be used in non-PEB processes may be lower, and a baking module may be judged to pass the non-PEB qualification tests, even if it would not pass the more stringent PEB qualification tests.

If the answer from the step 950 is yes, then the method 900 proceeds to step 960 to qualify the baking module as being ready to be used in actual semiconductor fabrication, particularly as a baking module in a post-exposure bake process. If the answer from the step 950 is no, then the method 900 proceeds to step 970 to determine whether an M number of the loops has been reached, where M>N. In some embodiments, M is equal to 10. As discussed above, the execution of steps 910 and 920 collectively count as a loop. If an M number of loops has not been reached, then the method goes back to step 910 again. If the M number of loops has been reached, and the "judging" results from steps 940-950 indicate that the baking module is still not ready for being used in production, then the method 900 proceeds to step 980 to disqualify the baking module. In some embodiments where the baking module was purchased from a vendor, the baking module may be sent back to that vendor for repair or replacement.

In other embodiments, certain tweaks may be done to the baking module without sending it back to the vendor. For example, the height of one or more of the gap pins 540 may be adjusted, or the vacuum pressure in one or more of the vacuum holes 550 may be adjusted, or the exhaust speed or configuration may be adjusted, in order to compensate for the lack of temperature uniformity. After these adjustments are made, the method 900 may be repeated again to see if the baking module (after having made these adjustments) can be qualified. If the baking module still cannot be qualified, then it may be sent back to the vendor. It is also understood that in some embodiments, these adjustments (regarding the gap pin, the vacuum holes, or exhaust components) may also be made after each judging process, e.g., after the steps 940-950 are performed.

Figure 13:
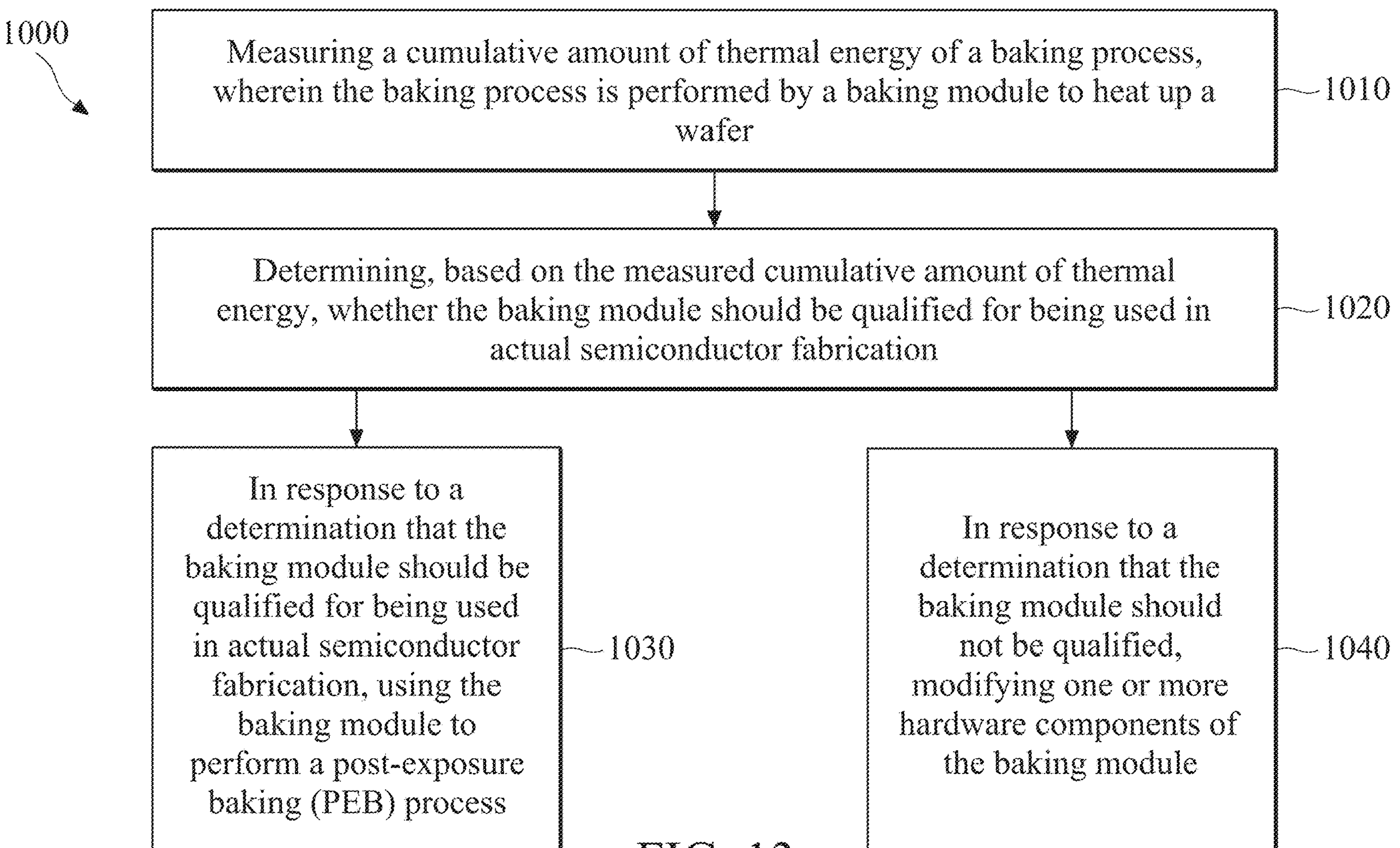
FIG. 13 is a flowchart of a method of performing qualification testing of a baking module in accordance with some embodiments of the present disclosure.

FIG. 13 is a flowchart illustrating a simplified method 1000 for performing qualification testing for a baking module. The method 1000 includes a step 1010 of measuring a cumulative amount of thermal energy of a baking process. The baking process is performed by a baking module to heat up a wafer.

The method 1000 includes a step 1020 of determining, based on the measured cumulative amount of thermal energy, whether the baking module should be qualified for being used in actual semiconductor fabrication.

The method 1000 includes a step 1030 of: in response to a determination that the baking module should be qualified for being used in actual semiconductor fabrication, using the baking module to perform a post-exposure baking (PEB) process.

The method 1000 includes a step 1040 of: in response to a determination that the baking module should not be qualified, modifying one or more hardware components of the baking module. Thereafter, the method 1000 may repeat steps 1010 and 1020. In some embodiments, the baking module includes a plurality of gap pins disposed between the wafer and a heating plate, and the modifying comprising adjusting a height of one or more of the gap pins. In some embodiments, the baking module includes a plurality of vacuum holes disposed in a heating plate, the vacuum holes each being configured to produce a partial vacuum to secure a position of the wafer, and the modifying comprising adjusting the partial vacuum produced by one or more of the vacuum holes. In some embodiments, the baking module includes an exhaust component configured to remove contaminants from the baking module, and the modifying comprising adjusting a speed of the exhaust component.

In some embodiments, the measuring step 1010 is performed using one or more heat sensors placed on the wafer.

In some embodiments, the measuring step 1010 comprises: measuring a plurality of temperatures of the wafer at a plurality of points in time, respectively; and calculating a sum of the plurality of temperatures as the cumulative amount of thermal energy.

In some embodiments, the method 1000 may repeat the measuring a plurality of times to obtain a plurality of different cumulative amounts of thermal energy, wherein each time the measuring is performed, a different one of a plurality of heat sensors is used. In that case, the determining comprises: calculating a standard deviation of the plurality of different cumulative amounts of thermal energy; and determining whether the calculated standard deviation passes a predefined threshold. In some embodiments, the calculating the standard deviation comprises calculating a three-sigma value.

In some embodiments, the baking module includes a plurality of heat zones, and wherein the determining step 1010 comprises the following sub-steps: determining, based on the measuring, a respective cumulative amount of thermal energy for each of the heat zones, wherein a first one of the heat zones has a maximum cumulative amount of thermal energy, and a second one of the heat zones has a minimum cumulative amount of thermal energy; calculating a difference between the maximum cumulative amount of thermal energy and the minimum cumulative amount of thermal energy; and determining whether the difference is less than a predefined threshold.

In some embodiments, the measuring is performed for a plurality of baking modules to yield a different cumulative amount of thermal energy for each of the baking modules; and the determining comprises determining whether the different cumulative amount of thermal energy is less than a predefined threshold.

It is understood that additional steps may be performed before, during, or after the steps 1010-1040 of FIG. 13. For example, the method 1000 may include a step of sending the baking module back to a vendor for repair or replacement if the baking module is disqualified. Other processes are not discussed in detail herein for reasons of simplicity.

Based on the above discussions, it can be seen that the present disclosure offers various advantages over conventional methods for qualifying baking modules. It is understood, however, that not all advantages are necessarily discussed herein, and other embodiments may offer different advantages, and that no particular advantage is required for all embodiments. One of the advantages is that by using a cumulative amount of thermal energy as a gauge for heat uniformity performance, the present disclosure can more accurately predict how well the baking module (containing the hot plate) will perform in the field. Thus, there is greater confidence that the baking module that pass the qualification testing can perform well in fabrication processes such as the PEB processes, where heat uniformity control is important. The devices fabricated using the baking modules qualified according to the aspects of the present disclosure will have improved performance, for example better critical dimension uniformity and critical dimension range. Another advantage is that the processes discussed above are compatible with existing fabrication process flow and are easy to implement.

The present disclosure provides for a method. The method includes: measuring a cumulative amount of thermal energy of a baking process, wherein the baking process is performed by a baking module to heat up a wafer; and determining, based on the measured cumulative amount of thermal energy, whether the baking module should be qualified for being used in actual semiconductor fabrication. In some embodiments, the measuring is performed using one or more heat sensors placed on the wafer. In some embodiments, the measuring comprises: measuring a plurality of temperatures of the wafer at a plurality of points in time, respectively; and calculating a sum of the plurality of temperatures as the cumulative amount of thermal energy. In some embodiments, the method further comprises: repeating the measuring a plurality of times to obtain a plurality of different cumulative amounts of thermal energy, wherein each time the measuring is performed, a different one of a plurality of heat sensors is used. In some embodiments, the determining comprises: calculating a standard deviation of the plurality of different cumulative amounts of thermal energy; and determining whether the calculated standard deviation passes a predefined threshold. In some embodiments, the calculating the standard deviation comprises calculating a three-sigma value. In some embodiments, the baking module includes a plurality of heat zones, and wherein the determining comprises: determining, based on the measuring, a respective cumulative amount of thermal energy for each of the heat zones, wherein a first one of the heat zones has a maximum cumulative amount of thermal energy, and a second one of the heat zones has a minimum cumulative amount of thermal energy; calculating a difference between the maximum cumulative amount of thermal energy and the minimum cumulative amount of thermal energy; and determining whether the difference is less than a predefined threshold. In some embodiments, the measuring is performed for a plurality of baking modules to yield a different cumulative amount of thermal energy for each of the baking modules; and the determining comprises determining whether the different cumulative amount of thermal energy is less than a predefined threshold. In some embodiments, the method further includes: in response to a determination that the baking module should not be qualified, modifying one or more hardware components of the baking module; and repeating the measuring and the determining after the one or more hardware components of the baking module has been modified. In some embodiments, the baking module includes a plurality of gap pins disposed between the wafer and a heating plate; and the modifying comprising adjusting a height of one or more of the gap pins. In some embodiments, the baking module includes a plurality of vacuum holes disposed in a heating plate, the vacuum holes each being configured to produce a partial vacuum to secure a position of the wafer; and the modifying comprising adjusting the partial vacuum produced by one or more of the vacuum holes. In some embodiments, the baking module includes an exhaust component configured to remove contaminants from the baking module; and the modifying comprising adjusting a speed of the exhaust component. In some embodiments, the method further includes: after a determination that the baking module should be qualified for being used in actual semiconductor fabrication, using the baking module to perform a post-exposure baking (PEB) process.

Another aspect of the present disclosure involves a method. The method includes: baking a test wafer that is placed inside a baking module; measuring, via one or more temperature sensors, a cumulative heat amount delivered to the test wafer during the baking; comparing the measured cumulative heat amount with a predefined cumulative heat amount threshold; in response to the comparing indicating that the measured cumulative heat amount is within the predefined cumulative heat amount threshold, determining that the baking module is qualified for actual semiconductor fabrication; and in response to the comparing indicating that the measured cumulative heat amount is outside of the predefined cumulative heat amount threshold, determining that the baking module is not qualified for actual semiconductor fabrication. In some embodiments, the method further includes: in response to the determining that the baking module is not qualified for actual semiconductor fabrication, performing one or more software or hardware adjustments for the baking module.

Another aspect of the present disclosure involves a system. The system includes: a baking module configured to heat up a test wafer; a plurality of heat sensors disposed within the baking module, the heat sensors each being configured to measure temperature data associated with the baking module; and a controller configured to perform operations that include: ramping up a temperature of the baking module over a period of time; determining, based on the measured temperature data as the temperature of the baking module is being ramped up, a cumulative heat amount delivered by the baking module over the period of time; and selectively qualifying the baking module as being usable for actual semiconductor fabrication based on the determined cumulative heat amount. In some embodiments, the plurality of heat sensors are implemented on different regions of the test wafer. In some embodiments, the baking module includes a plate having a plurality of heating channels, and wherein each of the heating channels is associated with one or more of the heat sensors. In some embodiments, the baking module is a part of a post-exposure bake (PEB) tool. In some embodiments, the selectively qualifying comprises: qualifying the baking module as being usable for actual semiconductor fabrication if the determined cumulative heat amount is within a predefined cumulative heat amount limit; and disqualifying the baking module for actual semiconductor fabrication if the determined cumulative heat amount exceeds a predefined cumulative heat amount limit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

securing a wafer onto a hot plate of a baking module, wherein the hot plate comprises a plurality of zones, and heat of each zone of the plurality of zones is configured to be independently applied;

configuring the baking module to perform a baking process to heat up the wafer;

providing a plurality of temperature measuring devices, at least one of the plurality of temperature measuring devices is placed at interface between two adjacent zones of the plurality of zones;

measuring, by each of the plurality of temperature measuring devices, a plurality of temperatures of a corresponding region of the wafer at a plurality of points in time for a predetermined duration during the baking process;

for each temperature measuring device of the plurality of temperature measuring devices, calculating a sum of its corresponding plurality of temperatures; and determining, based on the calculated sums, whether the baking module should be qualified for being used in actual semiconductor fabrication.

2. The method of claim 1, further comprising:

for each zone of the plurality of zones, averaging sums associated with corresponding temperature measuring devices of the plurality of temperature measuring devices.

3. The method of claim 1, wherein the wafer is heated from an initial temperature $T_0$ to a predetermined temperature Ts, and the measuring comprises:

after the wafer is heated up to have a predefined threshold temperature $T_{th}$, Starting measuring a plurality of temperatures of the wafer at a plurality of points in time for a predetermined duration, respectively, wherein $T_0<T_{th}<T_s$, and wherein, after the predetermined duration, a temperature of the wafer is greater than $T_{th}$ and less than $T_s$.

4. The method of claim 3, wherein the predetermined temperature $T_s$ is a temperature measured when the temperature of the wafer reaches a static level during the baking process.

5. The method of claim 4, wherein the predefined threshold temperature $T_{th}$ is a function of the predetermined temperature $T_s$.

6. The method of claim 1, wherein the determining comprises calculating a range variation of the calculated sums of the plurality of zones and comparing the range variation with a predetermined threshold.

7. The method of claim 1, wherein the determining comprises:

calculating a range variation of the calculated sums of the plurality of zones;

calculating a difference between the range variation and another range variation obtained from a different hot plate; and comparing the difference with a predetermined threshold.

8. The method of claim 1, further comprising:

in response to a determination that the baking module should not be qualified, modifying one or more hardware components of the baking module; and repeating the measuring and the determining after the one or more hardware components of the baking module has been modified.

9. The method of claim 8, wherein the baking module includes a plurality of gap pins disposed between the wafer and a heating plate and directly on the heating plate, and the modifying comprising adjusting a height of one or more of the gap pins.

10. The method of claim 9, wherein the baking module further includes a plurality of vacuum holes disposed in the heating plate, the vacuum holes each being configured to produce a partial vacuum to secure a position of the wafer, and the modifying further comprises adjusting the partial vacuum produced by one or more of the vacuum holes.

11. A method, comprising:

placing a plurality of heat sensors on a test wafer;

heating up the test wafer that is placed over a heating plate from an initial temperature to a predetermined temperature, wherein the predetermined temperature is measured when a temperature of the test wafer reaches a static level during the heating up, wherein the heating plate comprises a plurality of zones, and heat of each zone of the plurality of zones is configured to be independently applied, and one of the plurality of heat sensors is placed at interface between two adjacent zones of the plurality of zones;

for each of the plurality of heat sensors, after the test wafer is heated up to have a predefined threshold temperature $T_{th}$, starting measuring a plurality of temperatures at a plurality of predefined intervals for a predefined period of time and summing the measured plurality of temperatures as a respective cumulative amount of heat delivered to the test wafer as the test wafer is being heated up, wherein the predefined threshold temperature $T_{th}$ is a function of the predetermined temperature and is greater than the initial temperature;

for each zone of the plurality of zones, averaging cumulative amounts associated with corresponding heat sensors; and determining, based on averaged cumulative amounts associated with the plurality of zones, whether the heating plate should be qualified for being used in actual semiconductor fabrication.

12. The method of claim 11, wherein the determining comprises:

calculating a range variation of the averaged cumulative amounts associated with the plurality of zones; and comparing the range variation with a predetermined threshold.

13. The method of claim 11, wherein the determining comprises:

calculating a range variation of the averaged cumulative amounts associated with the plurality of zones;

calculating a difference between the range variation and another range variation obtained from a different hot plate; and comparing the difference with a predetermined threshold.

14. The method of claim 13, further comprising:

in response to the difference being less than a predefined threshold, qualifying the heating plate as being usable for actual semiconductor fabrication.

15. The method of claim 14, wherein the qualifying comprises qualifying the heating plate as being usable for performing a post-exposure baking (PEB) process.

16. A method, comprising:

placing a plurality of heat sensors on a test wafer;

placing the test wafer over a hot plate configured to generate heat, wherein the hot plate comprises a plurality of zones, and heat of each zone of the plurality of zones is configured to be independently applied, wherein at least one of the plurality of heat sensors is placed directly over an interface between two adjacent zones of the plurality of zones;

measuring, using the plurality of heat sensors, first plurality of cumulative amounts of heat, wherein each heat sensor of the plurality of heat sensors is configured to measure a corresponding first cumulative amount of heat experienced by a corresponding spot of the test wafer during a thermal process performed by the hot plate;

calculating a corresponding second cumulative amount of heat experienced by each of the plurality of zones, wherein the corresponding second cumulative amount of heat experienced is a function of the corresponding first cumulative amounts of heat associated with heat sensors of the plurality of heat sensors placed directly over that zone;

determining whether a range variation of a plurality of the second cumulative amount of heat experienced by the plurality of zones is less than a predefined threshold; and in response to a determination that the range variation is less than the predefined threshold, deeming the hot plate as being qualified to perform a post-exposure baking (PEB) process in semiconductor lithography.

17. The method of claim 16, wherein the measuring of the corresponding first cumulative amounts of heat further comprises:

before the thermal process, recording an initial temperature of the test wafer; and after the test wafer is heated up to have a predetermined target temperature, starting the measuring of a plurality of temperatures of the test wafer at a plurality of predefined intervals; and after the measuring of the plurality of temperatures, adding up the plurality of temperatures as the corresponding first cumulative amount of heat.

18. The method of claim 17, further comprising:

in response to a determination that the hot plate should not be qualified, performing adjustments for the hot plate; and repeating the measuring and the determining after the adjustments.

19. The method of claim 16, wherein the corresponding second cumulative amount of heat experienced by each zone of the plurality of zones is an average of all of the corresponding first cumulative amounts of heat associated with heat sensors of the plurality of heat sensors placed directly over that zone.

20. The method of claim 16, wherein a first zone of the plurality of zones is associated with only one heat sensor of the plurality of heat sensors, and a second zone of the plurality of zones is associated with two or more heat sensors of the plurality of heat sensors.

* * * * *